(12) United States Patent
Smith et al.

(10) Patent No.: US 8,243,526 B2
(45) Date of Patent: Aug. 14, 2012

(54) DEPLETION MODE CIRCUIT PROTECTION DEVICE

(75) Inventors: Michael Smith, Boise, ID (US); Vladimir Mikhalev, Boise, ID (US); Kenneth Marr, Boise, ID (US); Haitao Liu, Meridian, ID (US)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 12/653,437

(22) Filed: Dec. 14, 2009

(65) Prior Publication Data

US 2011/0140227 A1 Jun. 16, 2011

(51) Int. Cl.
*G11C 11/34* (2006.01)
*G11C 16/04* (2006.01)

(52) U.S. Cl. ............... 365/185.27; 365/185.29; 365/174

(58) Field of Classification Search ............. 365/185.27, 365/185.29, 174
See application file for complete search history.

(56) References Cited

U.S. PATENT DOCUMENTS

| | | | |
|---|---|---|---|
| 2006/0073647 A1* | 4/2006 | Inaba | 438/157 |
| 2006/0220131 A1* | 10/2006 | Kinoshita et al. | 257/347 |
| 2008/0067613 A1* | 3/2008 | Anderson et al. | 257/401 |
| 2008/0286913 A1* | 11/2008 | Anderson et al. | 438/156 |
| 2008/0303095 A1* | 12/2008 | Xiong et al. | 257/365 |
| 2010/0176438 A1* | 7/2010 | Lue et al. | 257/324 |
| 2010/0237436 A1* | 9/2010 | Inaba | 257/392 |

OTHER PUBLICATIONS

Sonsky et al., "Dielectric Resurf: Breakdown voltage control by STI layout in standard CMOS", IEEE International Electron Devices Meeting, IEDM Technical Digest, 2005, 4 pages.

* cited by examiner

*Primary Examiner* — Ly D Pham
(74) *Attorney, Agent, or Firm* — Winkle, PLLC

(57) ABSTRACT

A non-volatile microelectronic memory device that includes a depletion mode circuit protection device that prevents high voltages, which are applied to bitlines during an erase operation, from being applied to and damaging low voltage circuits which are electrically coupled to the bitlines.

15 Claims, 6 Drawing Sheets

DEPLETION MODE CIRCUIT PROTECTION DEVICE

BACKGROUND OF THE INVENTION

The present disclosure relates generally to the fabrication of non-volatile microelectronic memory. In at least one embodiment, the present disclosure relates to a depletion mode circuit protection device that prevents high voltage from bitlines during erase operation from damaging low voltage circuits that are electrically coupled to the bitlines.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
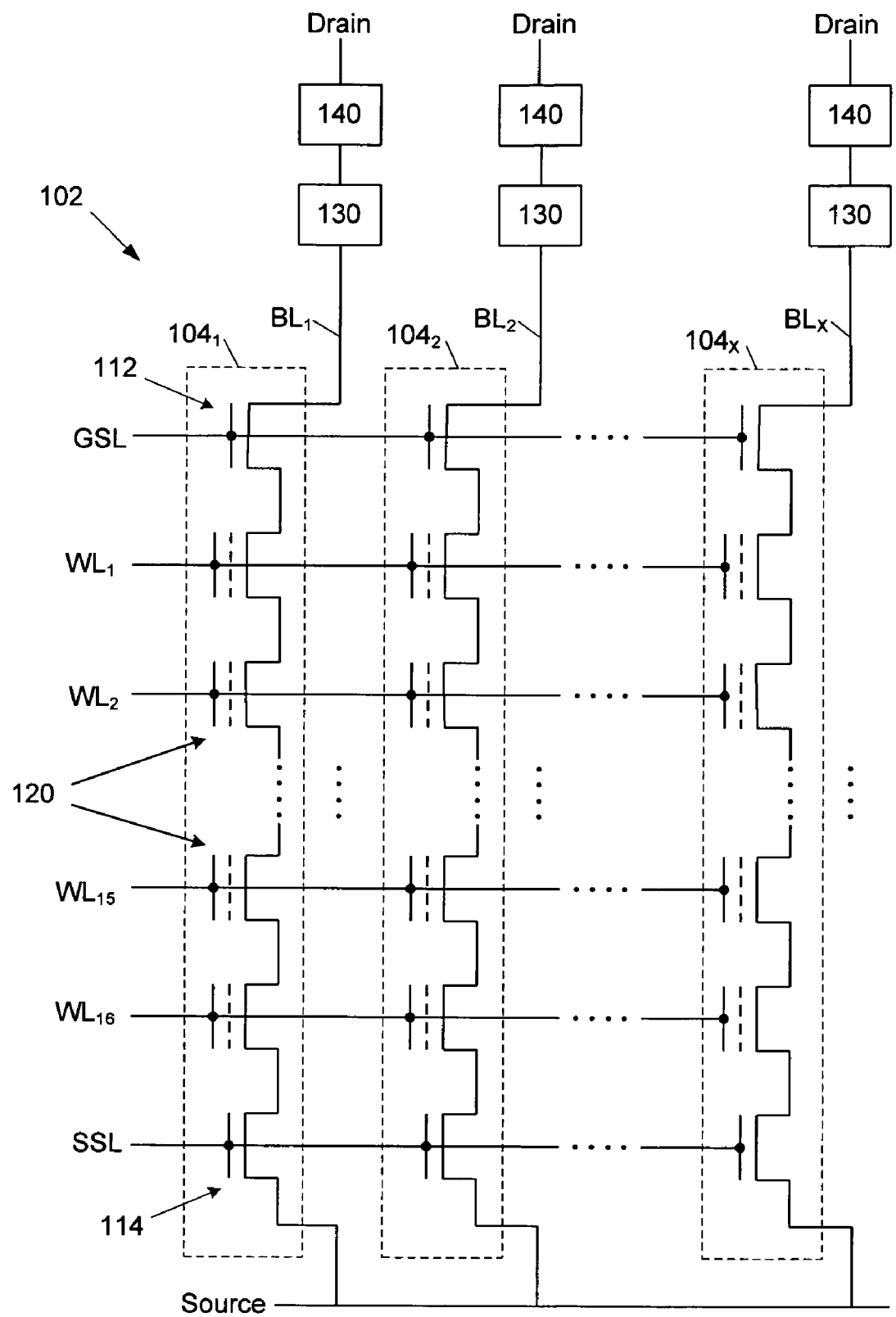
FIG. 1 is a circuit schematic of a NAND flash array with depletion mode circuit protection device.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Memory devices are integrated circuits that provide data storage of electronics devices, including volatile memory which loses stored information when not powered (e.g., RAM—Random Access Memory) and non-volatile memory which retain stored information even when not powered (e.g., flash memory). Non-volatile flash memory is generally used in portable devices, such as cellular telephones, personal digital assistants, portable digital media players, digital cameras, solid state computer hard drives, and the like.

Flash memory devices may include a plurality of memory cells, which are floating-gate transistors. The memory cells are typically stacked gated structures comprising a floating gate formed between a source and drain region on a semiconductor substrate, such as a mono-crystalline silicon material. The floating gate is electrically isolated from the underlying semiconductor substrate by a thin dielectric layer, and a control gate positioned which is positioned above the floating gate and electrically isolated therefrom by an inter-poly dielectric layer. The floating gate serves as a charge storage element for storing an electrical charge. This charge storage defines the memory state of that transistor, wherein the presence or lack of a stored charge represents a binary "1" or "0" state in one data bit.

A NAND flash memory has a cell array that includes a number of cell strings, each cell string constructed of memory cells connected in series. When a NAND flash memory is programmed utilizing the Fowler-Nordheim tunneling effect, a low voltage of about 0 volts is applied to the source and drain while a voltage of about 15 volts is applied to the control gate, so that electrons are injected into the floating gate from the semiconductor substrate to raise a threshold voltage thereof. It is referred to as being written with data "0" to become a programmed cell. When the flash memory is erased also utilizing the Fowler-Nordheim tunneling effect, a negative voltage of about 20 volts is applied to the control gate while a high voltage is applied to the semiconductor substrate, so that electrons move into the semiconductor substrate from the floating gate to lower a threshold voltage thereof. It stores a data "1" to become an erased cell. However, the erase voltage of 20 volts or more must be carefully managed to prevent it from being applied directly to low voltage circuits that may be in electrical communication with the bitlines of the memory array. Low voltage circuits usually designed to operate at 6 volts or less. Thus, erase voltages applied to the low voltage circuitry could cause significant damage thereto.

Embodiments of the present disclosure relate to the fabrication of non-volatile microelectronic memory. In at least one embodiment, the present disclosure relates to a depletion mode device, which is used as a protection device to prevent high voltage from bitline during erase operation from damaging low voltage circuit in the non-volatile microelectronic memory.

FIG. 1 is a circuit diagram illustrating a NAND flash memory circuit. The NAND flash memory circuit includes a memory cell array 102 which is composed of a number of flash memory cell strings $104_1, 104_2, \ldots,$ and $104_X$ connected to respective bitlines, $BL_1, BL_2, \ldots,$ and $BL_X$. While FIG. 1 illustrates three cell strings for convenience, it is understood that there may be any number of flash memory cell strings (represent as "x") within the memory cell array 102 in accordance with the dimension of a desired NAND flash memory device.

Each flash memory cell string $104_1$, $104_2$, ..., and $104_X$ includes a string selection transistor gate 112, a ground selection transistor gate 114, and a number of flash memory cells 120 connected in series between the string selection transistor gate 112 and the ground selection transistor gate 114. The string selection transistor gate 112, the ground selection transistor gate 114, and flash memory cells 120 of each string are coupled to a string selection line SSL, wordlines $WL_1$, $WL_2$, ..., $WL_{15}$, and $WL_{16}$, and a ground selection line GSL, respectively. The string selection line SSL, wordlines $WL_1$, $WL_2$, ..., $WL_{15}$, and $WL_{16}$, and a ground selection line GSL carry outputs from a row decoder (not shown).

As shown in FIG. 1, each of the memory cell strings $104_1$, $104_2$, ..., and $104_X$ is electrically shielded from low voltage circuitry 140 by a depletion mode circuit protection device 130. The low voltage circuitry 140 may be any circuitry electrically coupled to the memory cell strings $104_1$, $104_2$, ..., and $104_X$, which operates at voltages lower than the erase voltage required by the memory cell strings $104_1$, $104_2$, ..., and $104_X$, including, but not limited to dynamic data cache. It is understood that each depletion mode circuit protection device 130 may service more than a single memory cell string $104_1$, $104_2$, ..., and $104_X$, as more than one memory cell string $104_1$, $104_2$, ..., and $104_X$ may be coupled to a multiplexer (not shown) that is coupled to the depletion mode circuit protection device 130.

Figure 2:
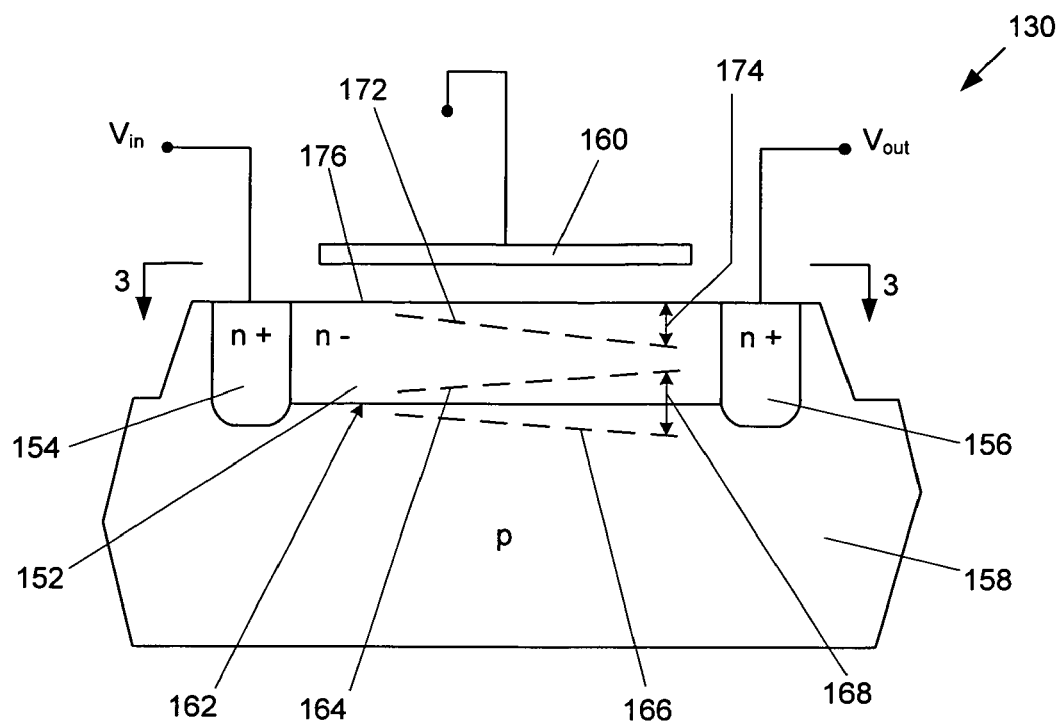
FIG. 2 is a side cross-sectional view of a depletion mode circuit protection device.
Figure 3:
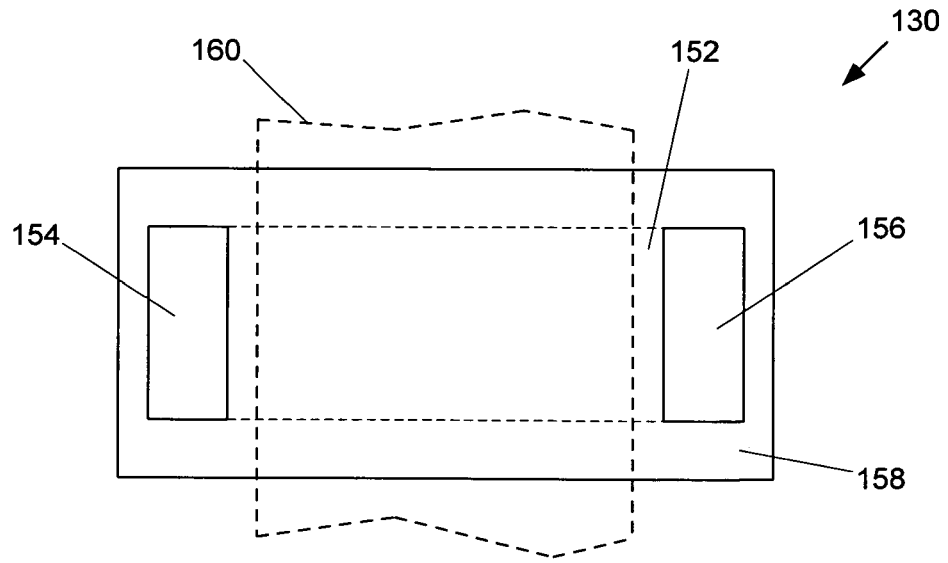
FIG. 3 is a top plan view of the depletion mode circuit protection device along line 3-3 of FIG. 2.

As shown in FIGS. 2 and 3, the depletion mode circuit protection device 130 may comprise a depletion region 152 between an high voltage side contact 154 and a low voltage side contact 156 formed in a substrate 158 with a conductive gate 160 (shown in shadow in FIG. 3) positioned proximate the depletion region 152 (bounded by dashed line in FIG. 3). The high voltage side contact 154 may be coupled to at least one memory cell string $104_1$, $104_2$, ..., and $104_X$ (see FIG. 1), illustrated as $V_{in}$, and the low voltage side contact 156 may be coupled to at low voltage circuitry 140, illustrated as $V_{out}$.

The depletion mode circuit protection device 130 may be fabrication by forming the high voltage side contact 154 and the low voltage side contact 156 in the substrate 158 by high implantation of a n-dopant (illustrated as "n+"), such as arsenic or phosphorus, into the substrate 158, which is p-type (illustrated as "p"), to a dopant concentration of between about $1\times10^{15}$ to $8\times10^{15}$ atoms per cubic centimeter and, in a more specific embodiment, to a dopant concentration of about $4\times10^{15}$ atoms per cubic centimeter. The depletion region 152 may also be formed by implanting the substrate 158; however, it is a low implantation (illustrated as "n−"), such as arsenic or phosphorus to a dopant concentration of between about $1\times10^{11}$ to $5\times10^{11}$ atoms per cubic centimeter and, in a more specific embodiment, to a dopant concentration of about $2\times10^{11}$ atoms per cubic centimeter, as will be understood to those skilled in the art. The conductive gate 160 may be made of any conductive material, including metals (such as copper or aluminum), metal alloys, and polysilicon. In one embodiment of the present description, the conductive gate may be made from the first interconnect metal layer (not shown), as will be understood to those skilled in the art. In another embodiment, the conductive gate 160 may be positioned approximately 1500 angstroms from the depletion region 152. The substrate 158 may be any applicable substrate including, but not limited to silicon, germanium, and silicon carbide.

Referring to FIG. 1 in conjunction with FIGS. 2 and 3, during "read" and other operations, the depletion mode circuit protection device 130 may behave as a resistor, where the low voltage signals from the low voltage circuitry 140 may pass through the depletion mode circuit protection device 130 to the memory cell array 102 bitlines $BL_1$, $BL_2$, ..., and $BL_X$. During the "erase" operation, where the bitlines $BL_1$, $BL_2$, ..., and $BL_X$ may rise or "float up" to an erase voltage of approximately 20 volts, the depletion region 152 of the depletion mode circuit protection device 130 depletes, blocking most of the high voltage coming from the bitlines $BL_1$, $BL_2$, ..., and $BL_X$, resulting in only relatively low voltage (in one embodiment, less than 6 volts) being potentially passed to the low voltage circuitry 140, thus may prevent any potential damage.

The depletion behavior of the depletion mode circuit protection device 130 is due to the depletion of the depletion region 152 at the depletion region-to-substrate junction 162 (where the substrate 158 may be at about 0 volts), and from the depletion of the depletion region 152 due to the conductive gate 160 (which may be at about 0 volts) generating an electric field. The depletion behavior at the depletion region-to-substrate junction 162 is illustrated with dashed lines 164 and 166, wherein the gap 168 expands from the high voltage side contact 154 and the low voltage side contact 156 to demonstrate the depletion. The depletion behavior proximate the conductive gate 160 is illustrated with dashed line 172, wherein the gap 174 between the dashed line 172 and a surface 176 of the depletion region proximate the conductive gate 160 expands from the high voltage side contact 154 and the low voltage side contact 156 to demonstrate the depletion.

In other words and as will be understood to those skilled in the art, at a certain full depletion voltage, pinch off will occur and the output voltage $V_{out}$ is no longer directly connected to the input voltage $V_{in}$, but is rather coupled capacitively via the depleted depletion region 152 and leakage current. Any leakage on the low voltage circuitry 140 will sink the small amount of leakage current, so that $V_{out}$ will not flow up to $V_{in}$. The $V_{out}$ will not float above the pinch-off voltage of the depletion region 152. Of course, the full depletion voltage is a function of doping level of the depletion region 152, the substrate 158 doping level, and the distance from the depletion region 152 to the conductive gate 160.

Figure 4:
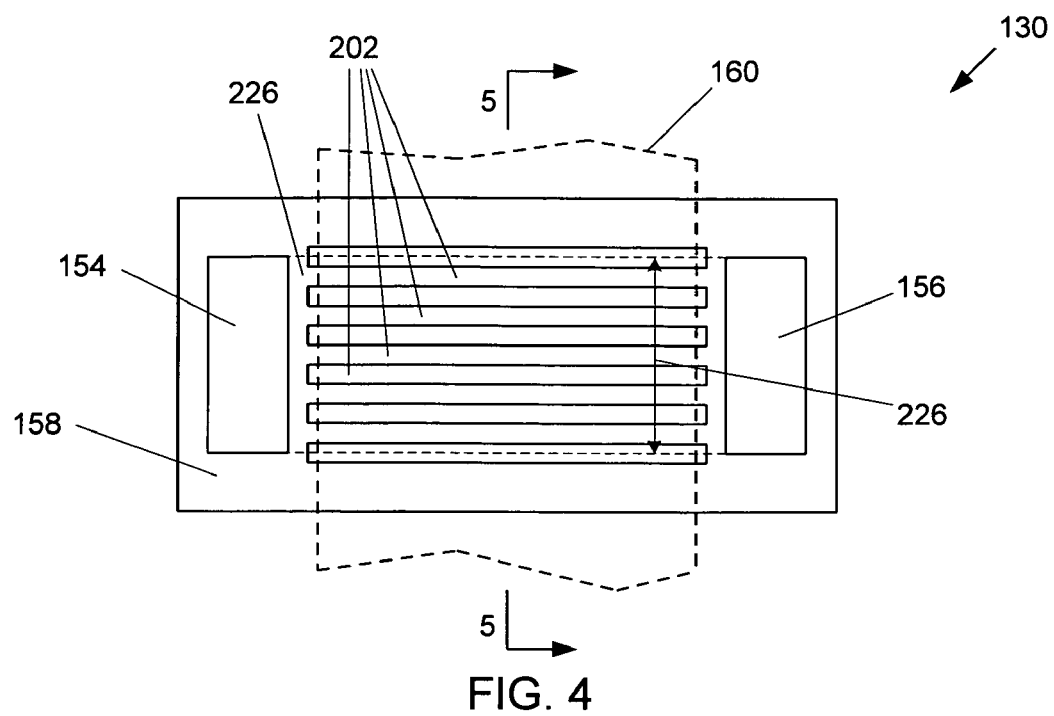
FIG. 4 is a top plan view of a multi-fin depletion mode circuit protection device.
Figure 5:
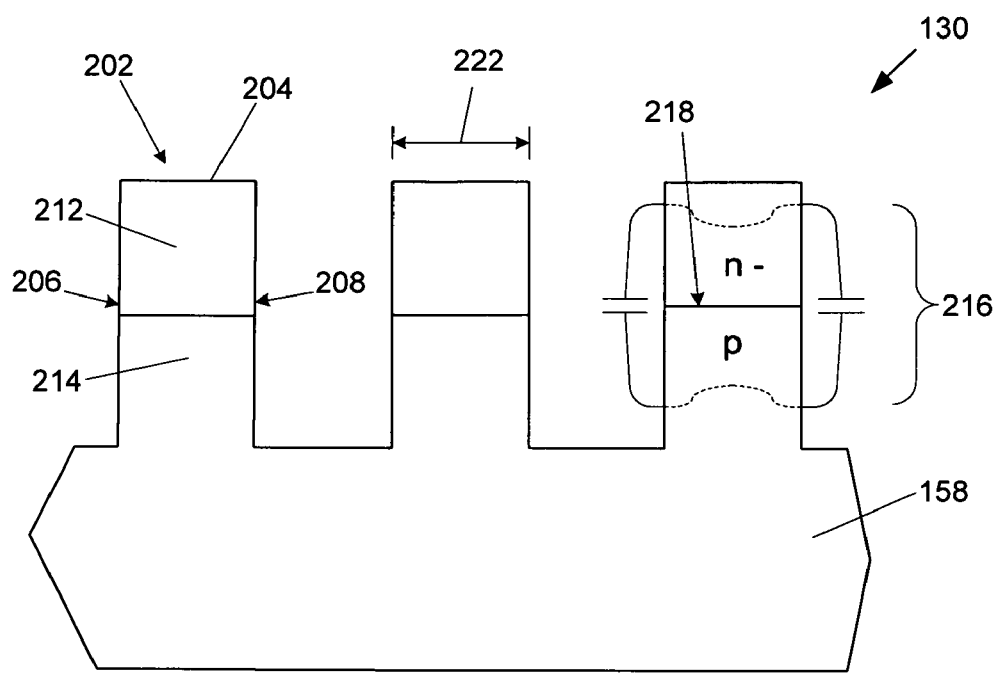
FIG. 5 is a side cross-sectional view of the multi-fin depletion mode circuit protection device along line 5-5 of FIG. 4.

As shown in FIGS. 4 and 5, the performance of the depletion mode circuit protection device 130 may be improved by forming substantially parallel fins 202 in the depletion region 152 and substrate 158 oriented in the direction between the high voltage side contact 154 and the low voltage side contact 156. As shown in FIG. 5, the fins 202 may include a top surface 204 and two opposing sides 206 and 208, and consists of a depletion region portion 212 and a substrate portion 214. In operation, each fin 202 will generate a depletion field 216, thus enhancing the depletion behavior at the depletion region-to-substrate junction 218 of each fin 202 and decrease pass voltage for a given doping level of the depletion region portion 212.

The fins 202 result in more depletion for a given applied voltage, thus lowering the maximum $V_{out}$. This can also allow higher doping of the depletion region portions 212 for a given desired $V_{out}$, thereby decreasing resistance during "read" and other operations, where voltage is being passed to the memory cell array 102 from the low voltage circuitry 140.

The fins 202 may be formed by etching or ablating the depletion region 152 of FIG. 2. The formation of the fins 202 by etching may be accomplished by any known technique, including standard and pattern doubling lithography techniques. The formation of the fins 202 by etching may be accomplished by any known technique, including laser and ion ablation techniques. In one embodiment, the ratio of the total of the widths 222 of the fin top surfaces 204 to a width 224 of the active area 226 may be about 1:2.

Figure 6:
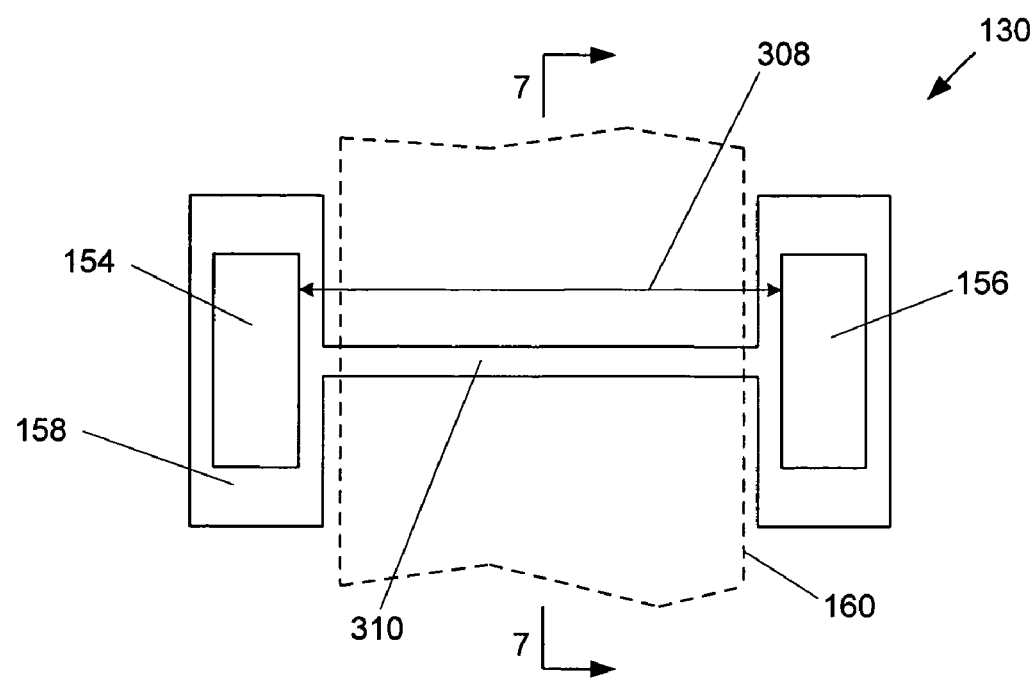
FIG. 6 is a top plan view of a single fin depletion mode circuit protection device.
Figure 7:
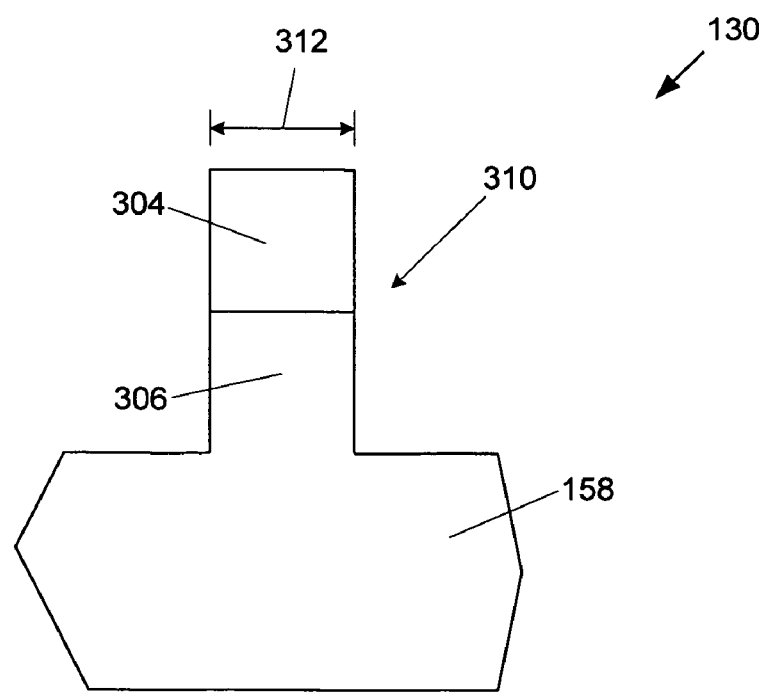
FIG. 7 is a side cross-sectional view of the single fin depletion mode circuit protection device along line 7-7 of FIG. 6.

FIGS. 6 and 7 illustrate a single fin embodiment of the depletion mode circuit protection device 130, wherein a single fin 310 consists of a depletion region portion 304 and a substrate portion 306 extending between the high voltage side contact 154 and a low voltage side contact 156. The single fin embodiment of the depletion mode circuit protection device 130 has advantages as discussed for the multi-fin embodiment of FIGS. 4 and 5 with a more compact design. In one embodiment, a spacing 308 between the high voltage side contact 154 and a low voltage side contact 156 may be between about 0.5 um and 2.0 um (and in a specific embodiment, about 1.5 um), a width 312 of the single fin 310 may be between about 0.02 um and 1.0 um (and in a specific embodiment, about 0.1 um), and a n-type doping level of the depletion region portion 304 is about $3 \times 10^{17}$ atoms of arsenic or phosphorus or other n-type dopant per cubic centimeter.

Although the present description is directed toward memory devices, it is understood that the depletion mode circuit protection devices described herein may be implemented in any circuit design or device where a circuit protection device is desired. Furthermore, although the present description is directed to an n-type device, the description is equally applicable to a p-type device.

Figure 8:
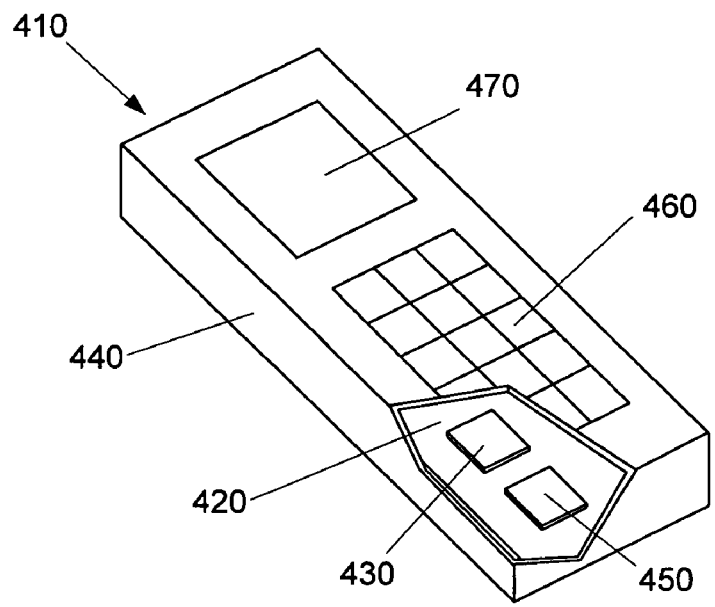
FIG. 8 illustrates an embodiment of a portable electronic device.

FIG. 8 illustrates an embodiment of a portable electronic device 410, such as a cellular telephone or a personal data assistant (PDA), digital media player, of the like. The portable device 410 may comprise a substrate 420 within a housing 430. The substrate 420 may have various electronic components electrically coupled thereto including a microprocessor 440, such as central processing units (CPUs), chipsets, graphics processor, ASICs, or other command/data processing device, and including at least one memory device 450 having at least one depletion mode circuit protection device, as described in the present description. The substrate 420 may be attached to various peripheral devices including an input device, such as keypad 460, and a display device, such an LCD display 470.

Figure 9:
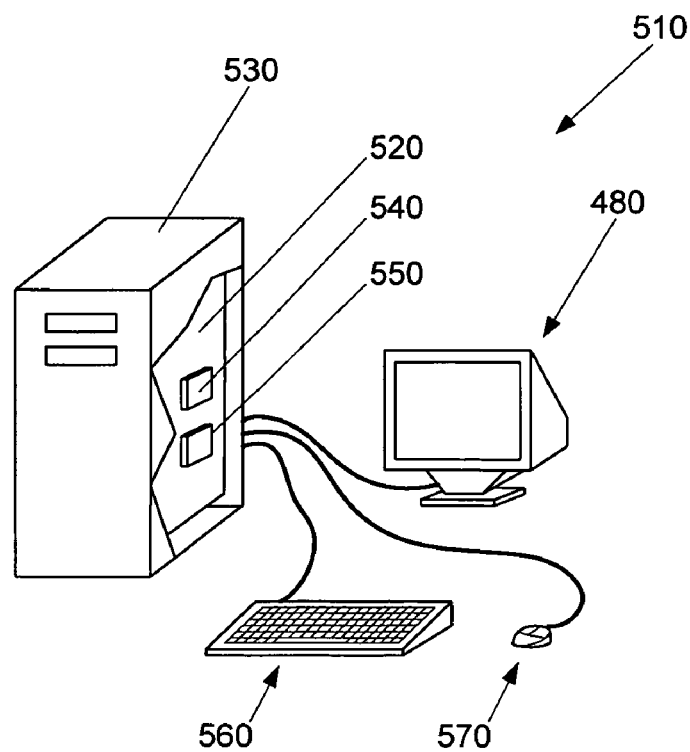
FIG. 9 illustrates an embodiment of a computer system.

FIG. 9 illustrates an embodiment of a computer system 510. The computer system 510 may comprise a substrate or motherboard 520 within a housing 530. The motherboard 520 may have various electronic component electrically coupled thereto including a microprocessor 540, such as a central processing units (CPUs), chipsets, graphics processor, ASICs, or other command/data processing device, and at least one memory device 550, including but not limited to, a BIOS chip, a solid state drive, and the like, having at least one depletion mode circuit protection device, as described above. The substrate or motherboard 520 may be attached to various peripheral devices including inputs devices, such as a keyboard 560 and/or a mouse 570, and a display device, such as a monitor 580.

Figure 10:
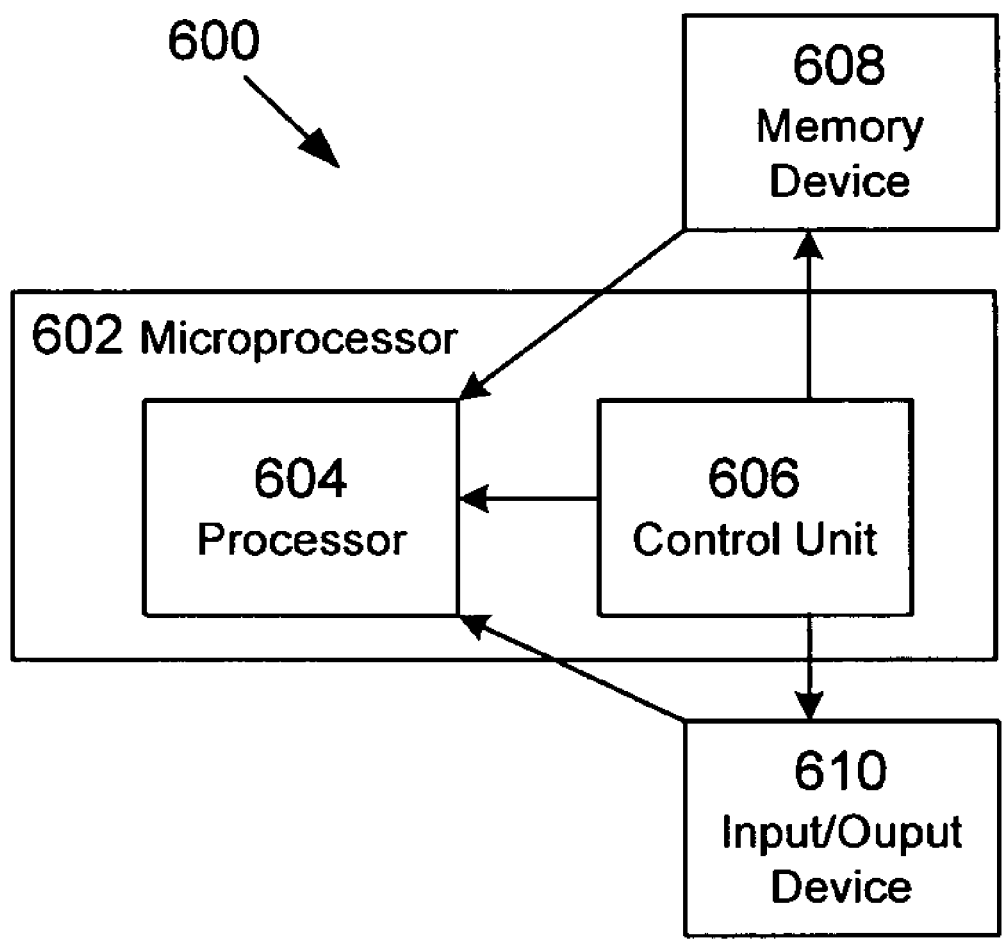
FIG. 10 is a block diagram of an electronic system.

FIG. 10 illustrates a block diagram of an electronic system 600. The electronic system 600 can correspond to, for example, the portable system 410 of FIG. 8, the computer system 510 of FIG. 9, a process control system, or any other system that utilizes a processor and an associated memory. The electronic system 600 may have a microprocessor 602 (having a processor 604 and control unit 606), a memory device 608, and an input/output device 610 (it is, of course, understood that the electronic system 600 can have a plurality of processors, control units, memory device units and/or input/output devices in various embodiments). In one embodiment, the electronic system 600 may have a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include flash memory having at least one microelectronic cell having a depletion mode circuit protection device.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A microelectronic device, comprising:
    a memory cell array;
    a depletion mode circuit protection device electrically coupled to the memory cell array; and
    low voltage circuitry electrically coupled to the depletion mode circuit protection device;
    wherein the depletion mode circuit protection device comprises:
    a high voltage side contact formed in a substrate electrically coupled to the memory cell array;
    a low voltage side contact formed in the substrate electrically coupled to the low voltage circuitry;
    at least one fin formed in the substrate comprising a depletion region portion and a substrate portion, wherein the at least one fin extends substantially between the high voltage side contact and the low voltage side contact; and
    a conductive gate proximate at least one fin depletion region portion.

2. The microelectronic device of claim 1, wherein the depletion region comprises arsenic or phosphorus implanted in the substrate.

3. The microelectronic device of claim 1, wherein the at least one fin comprises a single fin.

4. The microelectronic device of claim 1, wherein the at least one fin comprises a plurality of fins.

5. The microelectronic device of claim 4, wherein the plurality of fins are substantially parallel.

6. A depletion mode circuit protection device, comprising:
    a high voltage side contact formed in a substrate;
    a low voltage side contact formed in the substrate;
    at least one fin formed in the substrate comprising a depletion region portion and a substrate portion, wherein the at least one fin extends substantially between the high voltage side contact and the low voltage side contact; and
    a conductive gate proximate at least one fin depletion region portion.

7. The microelectronic device of claim 6, wherein the depletion region portion comprises arsenic or phosphorus implanted in the substrate.

8. The depletion mode circuit protection device of claim 6, wherein the at least one fin comprises a single fin.

9. The depletion mode circuit protection device of claim 6, wherein the at least one fin comprises a plurality of fins.

10. The depletion mode circuit protection device of claim 9, wherein the plurality of fins are substantially parallel.

11. An electronic system, comprising:
    a processor; and
    a memory device in data communication with the processor, the memory device comprising:
    a memory cell array;
    a depletion mode circuit protection device electrically coupled to the memory cell array; and
    low voltage circuitry electrically coupled to the depletion mode circuit protection device;
    wherein the depletion mode circuit protection device comprises:
    a high voltage side contact formed in a substrate electrically coupled to the memory cell array;
    a low voltage side contact formed in the substrate electrically coupled to the low voltage circuitry;
    at least one fin formed in the substrate comprising a depletion region portion and a substrate portion, wherein the at least one fin extends substantially between the high voltage side contact and the low voltage side contact; and
    a conductive gate proximate at least one fin depletion region portion.

12. The electronic system of claim 11, wherein the depletion region comprises arsenic or phosphorus implanted in the substrate.

13. The electronic system of claim 11, wherein the at least one fin comprises a single fin.

14. The electronic system of claim 11, wherein the at least one fin comprises a plurality of fins.

15. The electronic system of claim 14, wherein the plurality of fins are substantially parallel.

* * * * *